US012696520B2

(12) United States Patent
Abou-Alfotouh et al.

(10) Patent No.: US 12,696,520 B2
(45) Date of Patent: Jul. 28, 2026

(54) COUPLED INDUCTORS WITH GaN SWITCHES IN GaN 3D POWER BLOCK

(71) Applicant: Intel Corporation, Santa Clara, CA (US)

(72) Inventors: Ahmed Abou-Alfotouh, Dublin, CA (US); Jonathan Douglas, Cave Creek, AZ (US); Alan Wu, Toronto (CA); Nachiket Venkappayya Desai, Portland, OR (US); Han Wui Then, Portland, OR (US); Harish Krishnamurthy, Beaverton, OR (US); Kaladhar Radhakrishnan, Chandler, AZ (US); Sanka Ganesan, Chandler, AZ (US); Krishnan Ravichandran, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 17/706,454

(22) Filed: Mar. 28, 2022

(65) Prior Publication Data

US 2023/0307441 A1    Sep. 28, 2023

(51) Int. Cl.
| | |
|---|---|
| *H10D 84/01* | (2026.01) |
| *H01F 27/24* | (2006.01) |
| *H01F 27/28* | (2006.01) |
| *H01F 27/40* | (2006.01) |
| *H05K 1/181* | (2026.01) |
| *H10D 1/20* | (2025.01) |
| *H10D 30/47* | (2025.01) |

(Continued)

(52) U.S. Cl.
CPC ............. *H10D 84/01* (2025.01); *H01F 27/24* (2013.01); *H01F 27/28* (2013.01); *H01F 27/40* (2013.01); *H05K 1/181* (2013.01); *H10D 1/20* (2025.01); *H10D 30/475* (2025.01); *H10D 62/8503* (2025.01); *H10D 64/111* (2025.01); *H05K 2201/1003* (2013.01); *H05K 2201/10734* (2013.01)

(58) Field of Classification Search
CPC .......... H01F 27/24; H01F 27/28; H01F 27/40; H01F 3/14; H10D 1/20; H10D 30/475; H10D 62/8503; H10D 64/111; H10D 64/518; H10D 84/82; H10D 62/151; H10D 64/513; H05K 2201/1003; H05K 1/181; H05K 2201/10734
See application file for complete search history.

(56) References Cited

U.S. PATENT DOCUMENTS

| | | | | |
|---|---|---|---|---|
| 9,240,271 | B2 | 1/2016 | Liang | |
| 2013/0105812 | A1* | 5/2013 | Ishigaki | H10D 64/513 |
| | | | | 257/192 |

(Continued)

*Primary Examiner* — John P. Dulka

(74) *Attorney, Agent, or Firm* — Schwabe, Williamson & Wyatt, P.C.

(57) ABSTRACT

Embodiments disclosed herein include a coupled inductor. In an embodiment, the coupled inductor comprises a first inductor and a second inductor. In an embodiment, the first inductor can be coupled to the first inductor. In an embodiment, the coupled inductor further comprises a first switch coupled to the first inductor, where the first switch comprises gallium and nitrogen, and a second switch coupled to the second inductor, where the second switch comprises gallium and nitrogen.

18 Claims, 8 Drawing Sheets

(51) Int. Cl.
  *H10D 62/85* (2025.01)
  *H10D 64/00* (2025.01)

(56) References Cited

U.S. PATENT DOCUMENTS

| | | | | |
|---|---|---|---|---|
| 2014/0015508 | A1* | 1/2014 | Liang | H01F 3/10 |
| | | | | 323/305 |
| 2014/0151747 | A1* | 6/2014 | Jeon | H10D 64/411 |
| | | | | 257/194 |
| 2017/0148912 | A1* | 5/2017 | Chu | H10D 64/111 |
| 2019/0006334 | A1* | 1/2019 | Gardner | H01L 25/16 |
| 2019/0115851 | A1* | 4/2019 | Otake | H01F 27/38 |
| 2020/0227544 | A1* | 7/2020 | Then | H10D 30/475 |
| 2020/0373297 | A1* | 11/2020 | Nidhi | H10D 62/8503 |
| 2021/0399125 | A1* | 12/2021 | Huang | H10D 30/015 |

* cited by examiner

COUPLED INDUCTORS WITH GaN SWITCHES IN GaN 3D POWER BLOCK

TECHNICAL FIELD

Embodiments of the present disclosure relate to electronic packages, and more particularly to electronic packages with gallium nitride (GaN) switches for coupled inductors.

BACKGROUND

Current density has become a critical design parameter, especially for accelerator modules. At the same time, the SoC package has been growing to meet functionality and performance requirements. In addition, the SoC node has been shrinking significantly, much faster than the standard voltage regulator (VR) node. The shrinking SoC node has pushed the required current load (ILoad) to grow exponentially beyond the current VR technology. Furthermore, the form factors of such modules are also set by industry standards, and the footprint cannot be easily expanded to accommodate more VR support.

The current available solutions to the current density problem require too many components for every electric rail, or comprise fundamental design parameters. For high rail-count designs (e.g., 13 or more rails), it is not currently possible to fit all the necessary VR components on the board. For most size-optimized available modules in the market, the fundamental design parameters are necessarily compromised. For example, the thermal resistance is too high, which makes it difficult to cool high current solutions. Other solutions may be able to deliver more current with reasonable thermal resistance, but the efficiency has been compromised, which impacts the total solution performance.

One current solution is the use of silicon driver and MOSFET (DrMOS) at high switching frequencies. However, the silicon is not suitable for high frequency operation, and increases to the current density end up with loosing efficiency. Additionally, Si DrMOS applications require high profile inductors that are beyond the limits of standard form factors (e.g., PCIe).

EMBODIMENTS OF THE PRESENT DISCLOSURE

Figure 1A:
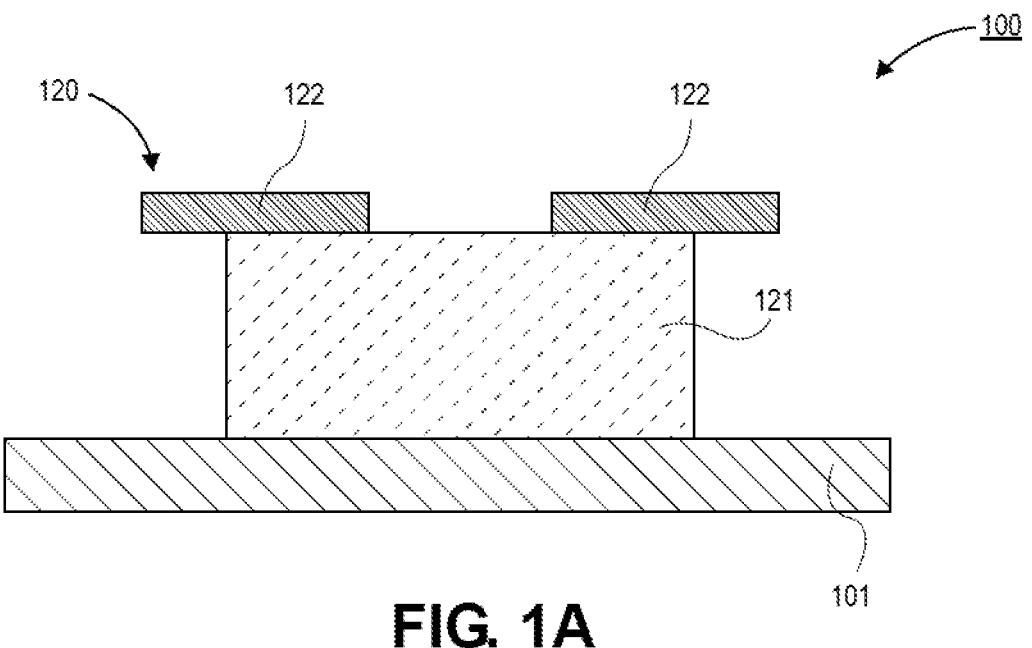
FIG. 1A is a cross-sectional illustration of a voltage regulator (VR) module with a coupled inductor and a pair of GaN switches, in accordance with an embodiment.

Described herein are electronic packages with gallium nitride (GaN) switches for coupled inductors, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing voltage regulator (VR) solutions are not capable of supporting advanced computing systems, such as accelerator modules, advanced processing units, and/or advanced graphics processing units. Ultimately, existing solutions are used, and design tradeoffs are accepted. Accordingly, embodiments disclosed herein include new VR solutions that enable support for the most advanced applications, while still maintaining suitable form factors that align with those currently used in the industry today.

A first problem to solve is the need to build small magnetics components (e.g., small inductors) in terms of area and volume. Small magnetics require high switching frequencies. Currently, silicon switches (e.g., silicon driver MOSFET (DrMOS)) are used and the switching speed is maxed out. However, using high switching speeds (e.g., greater than 3 MHz) results in a decrease in the efficiency.

A second problem to solve is the need to build non-linear inductors. In such application, high inductances are used for high efficiency operations, and low inductance is best used for when the optimal load transient behavior is needed. This requires different saturation points at different current levels. Typical discrete inductors with ferrite material only have a single saturation point, and are not suitable for non-linear applications.

A third problem to solve is the need for high-temperature compatible VR modules. A high-temperature compatible VR module will typically have a low thermal resistance and a high operation temperature capability. However, in existing Si DrMOS solutions, the max junction temperature is only around 105° C. for reliability reasons.

A fourth problem to solve is the need to build high current density solutions. Currently, building a high current density solution runs contrary to the solutions to problems 1-3 described above. As such, there is not currently a viable solution for building high current density VR modules suitable for advanced devices.

Accordingly, embodiments disclosed herein include VR modules that are fabricated with a coupled inductor architecture that utilizes switches that are fabricated from a gallium nitride (GaN) semiconductor material. Replacing Si DrMOS with GaN DrMOS devices provides a wide bandgap semiconductor material. Additionally, the GaN DrMOS devices are suitable to operate at higher switching frequencies than Si DrMOS devices. For example, GaN semiconductor devices may switch approximately 5 times to approximately 10 times faster than silicon devices. The higher switching speeds allow for improved efficiency. Also, GaN devices are capable of operation at higher junction temperatures. For example, GaN junction temperatures may be up to approximately 125° C., which is approximately 20° C. higher than silicon junction temperatures. Accordingly, the use of GaN switching devices addresses the first problem and the third problem described above.

With respect to the second problem described above, embodiments utilize a coupled inductor architecture. The coupled inductors described herein include two saturation points that enables achieving high inductance at the desired current range. This improves efficiency, and enables low inductance at high current in order to achieve excellent load transient behavior.

With respect to the fourth problem described above, embodiments disclosed herein utilize a two-phase module that includes a pair of GaN DrMOS devices with a coupled inductor structure. Such modules may be a single output module or a two-output module. Additionally, pluralities of the modules may be coupled together in order to provide bigger VR systems as needed and per available space. For example, a VR system with four-phase modules may allow up to four outputs. VR systems with up to 14-phase modules are described herein, though even larger VR systems may be fabricated by coupling together additional modules, if space is available on the board. In a particular embodiment, a multi-phase, multi-output VR system may have the capability of delivering approximately 800 A or more (continuous) and up to approximately 1,600 A (peak) for 13 rails, which is not achievable with currently available VR solutions. As such, advanced processing systems with limited board area can be enabled in accordance with embodiments disclosed herein.

Referring now to FIG. 1A, a cross-sectional illustration of a portion of an electronic system 100 is shown, in accordance with an embodiment. The illustrated embodiment depicts a board 101 (such as a printed circuit board (PCB)) to which the VR module 120 is coupled. In an embodiment, the VR module 120 may be coupled to the board 101 with any suitable interconnect architecture (not shown). For example, the VR module 120 may be surface mounted to the board 101 (e.g., with solder balls or the like).

In an embodiment, the VR module 120 may comprise an inductor 121. In a particular embodiment, the inductor 121 may be a coupled inductor. That is, the inductor 121 may include two individual inductors that can be coupled together in one state, or which can be operated independently in another state. In the illustrated embodiment, the inductor 121 is shown as a simple box. However, it is to be appreciated that the inductor 121 may have a more complex structure. The more complex structure of a coupled inductor and an explanation of how the coupled inductor functions is provided in greater detail below.

In an embodiment, the VR module 120 may further comprise a pair of switches 122. The switches 122 may be semiconductor switches, such as MOS transistors or the like. The pair of switches 122 may be used to operate the inductor 121. In the case of a coupled inductor, a first switch may control a first inductor, and a second switch may control a second inductor. In a particular embodiment, the switches 122 comprise a GaN channel. The use of GaN as the channel material allows for faster switching frequencies (e.g., approximately 5 times to approximately 10 times faster than a silicon channel). As such improved efficiencies are provided. Additionally, the maximum junction temperature of GaN devices is greater than the maximum junction temperature of silicon devices. For example, the maximum junction temperature may be approximately 125° C. in some embodiments. A more detailed description of the structure of the GaN switches 122 is provided below.

Figure 1B:
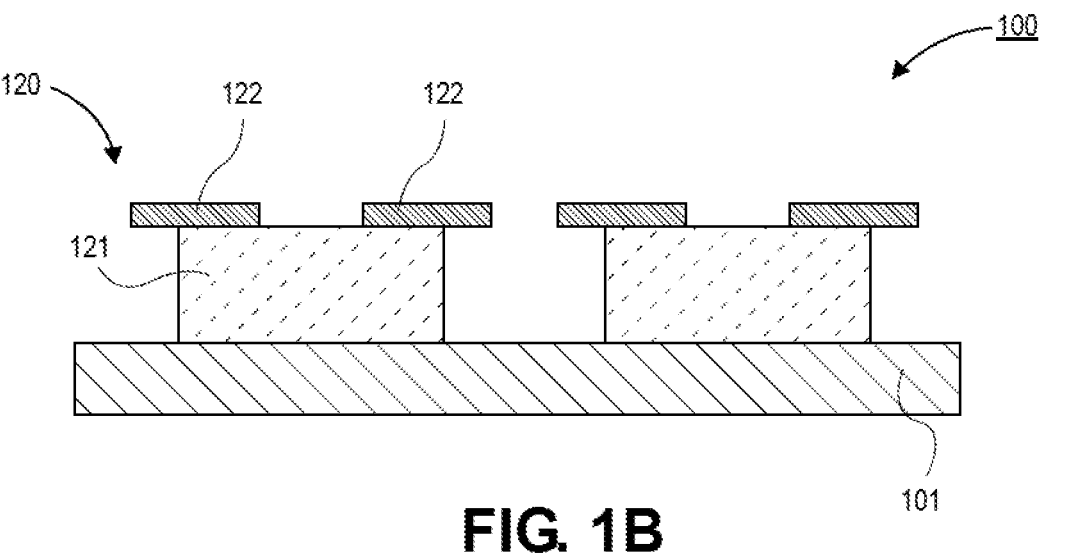
FIG. 1B is a cross-sectional illustration of a pair of VR modules with a coupled inductor and a pair of GaN switches, in accordance with an embodiment.

Referring now to FIG. 1B, a cross-sectional illustration of a portion of an electronic system 100 is shown, in accordance with an additional embodiment. As shown, a pair of VR modules 120 may be provided on the board 101. The pair of VR modules 120 may be coupled together in order to provide enhanced VR performance to the electronic system 100. For example, the embodiment shown in FIG. 1B may include up to four outputs that can be used for VR purposes.

Figure 1C:
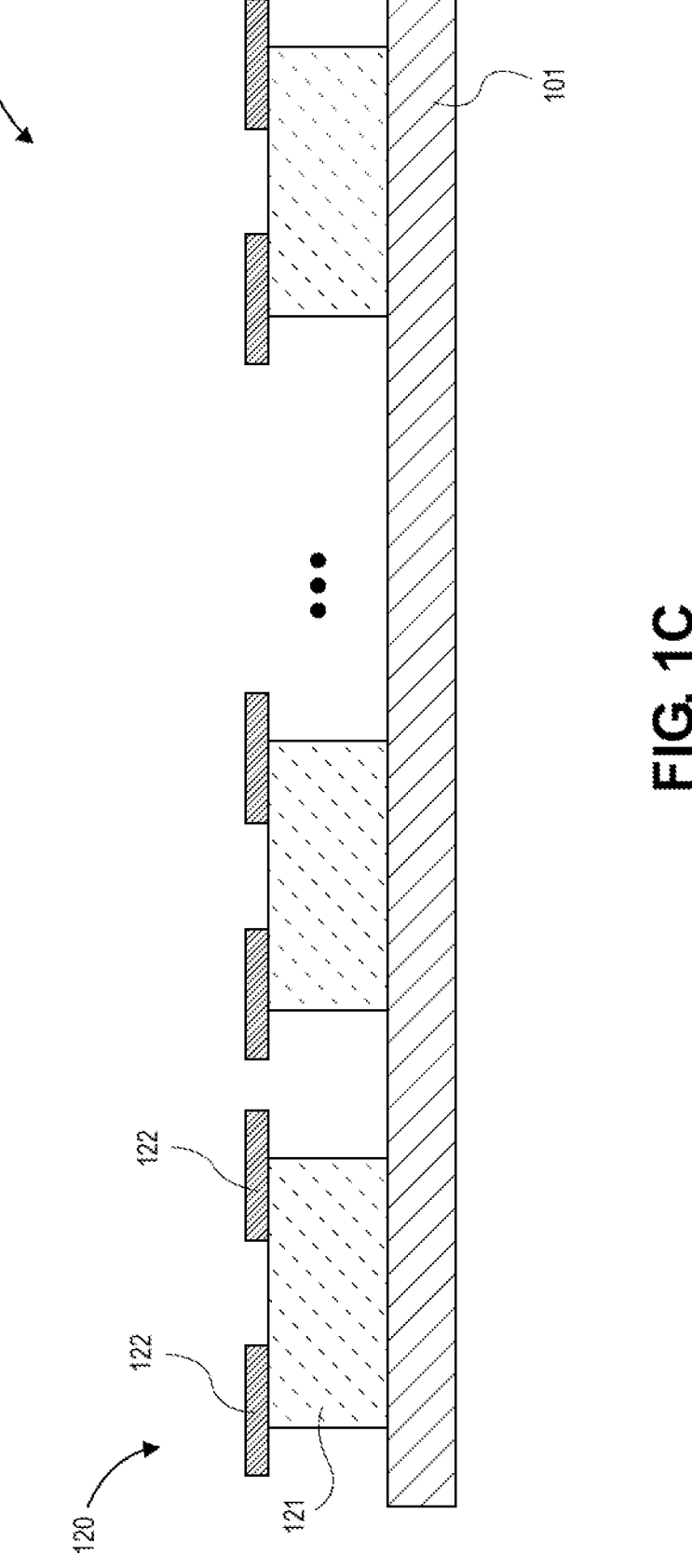
FIG. 1C is a cross-sectional illustration of a plurality of VR modules with a coupled inductor and a pair of GaN switches, in accordance with an embodiment.

Referring now to FIG. 1C, a cross-sectional illustration of a portion of an electronic system 100 is shown, in accordance with yet another embodiment. As shown, a plurality of VR modules 120 are provided on the board 101. That is, the number of VR modules 120 may only be limited by the available space on the board. For example, seven VR modules 120, eight VR modules 120, or more may be included on the board 101. As such, the scaling of VR performance is excellent when using embodiments disclosed herein.

Figure 2:
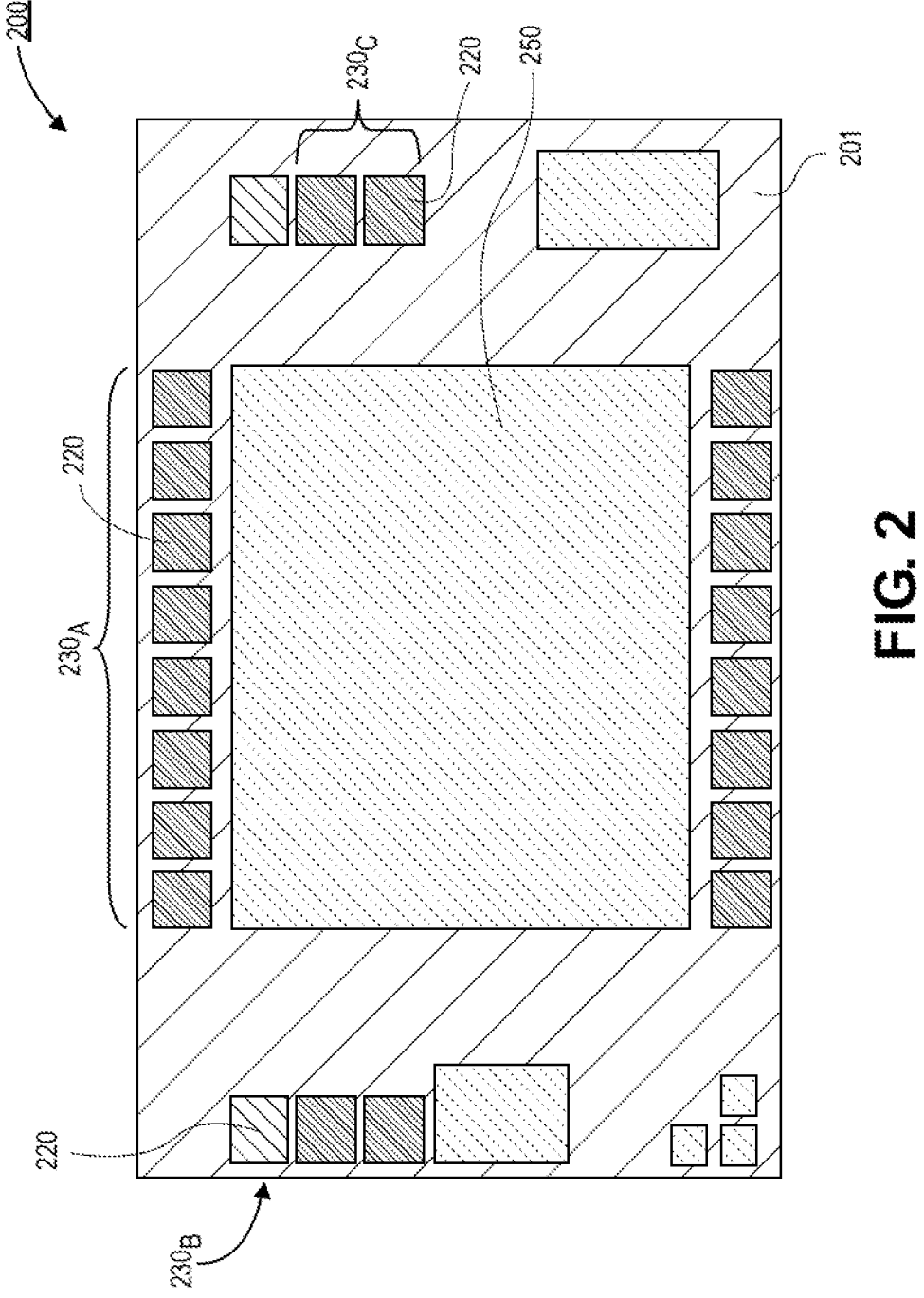
FIG. 2 is a plan view illustration of a board with various VR modules that enable a scalable solution for an application with a high number of rails, in accordance with an embodiment.

Referring now to FIG. 2, a plan view illustration of an electronic system 200 is shown, in accordance with an embodiment. As shown, the electronic system 200 may comprise a board 201, such as a PCB. In an embodiment, an electronic package 250 may be coupled to the board 201. The electronic package 250 may comprise a package substrate and one or more dies. In a particular embodiment, the one or more dies comprise graphics processors, processors, accelerators, and/or the like. The electronic package 250 may be provided power that is supplied through one or more arrays 230 of VR modules 220. For example, a first array 230A may include eight VR modules 220 that are coupled together, a second array 230B may include a single VR module 220, and a third array 230c may include a pair of VR modules 220. It is to be appreciated that electronic systems 200 may include fewer or more VR modules 220 and/or VR arrays 230.

Figure 3:
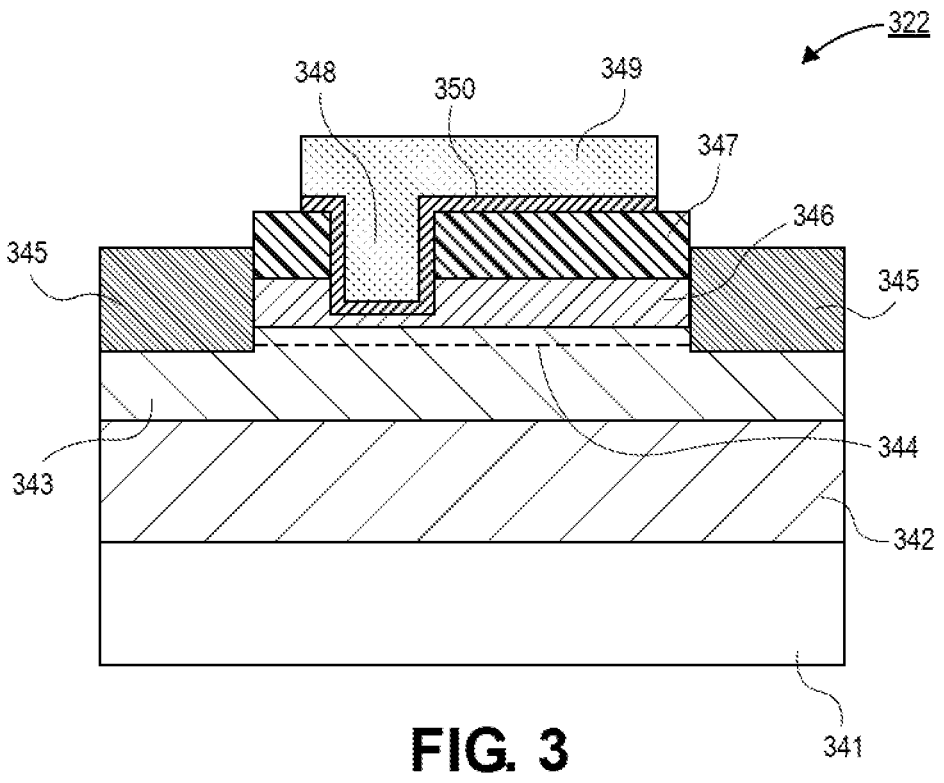
FIG. 3 is a cross-sectional illustration of a GaN transistor that may be used as a switch in the VR module, in accordance with an embodiment.

Referring now to FIG. 3, a cross-sectional illustration of a switch 322 that may be used in a VR module is shown, in accordance with an embodiment. In an embodiment, the switch 322 may include a semiconductor substrate 341. The semiconductor substrate 341 may be a silicon substrate, or the like. In a particular embodiment, the semiconductor substrate 341 may be singulated from a larger wafer or substrate on which a plurality of switches 322 are fabricated. For example, the semiconductor substrate 341 may be a part of (or singulated from) a 200 mm wafer or a 300 mm wafer. Though, it is to be appreciated that the switch 322 may be fabricated from substrates with other form factors.

In an embodiment, a buffer layer 342 may be provided over the semiconductor substrate 341. The buffer layer 342 may be a graded semiconductor region (graded vertically) that transitions the lattice constant of the semiconductor substrate 341 to the lattice constant of the channel layer 343. For example, the semiconductor substrate 341 may comprise silicon, the channel layer 343 may comprise gallium and nitrogen (e.g., GaN), and the buffer layer 342 comprises a graded semiconductor material that transitions the lattice constant from the lattice constant of silicon to the lattice constant of gallium nitride. In an embodiment, buffer layer 342 may also function as a back-barrier layer in order to enable higher voltage capability.

In an embodiment, the channel layer 343 may comprise gallium and nitrogen. The exact volume percentages of gallium and nitrogen may be controlled in order to provide a desired electrical performance. That is, in some embodiments, the stoichiometry of the channel may be other than one-to-one gallium to nitrogen. In an embodiment, the channel layer 343 may have a non-uniform thickness. For example, the portion of the channel layer 343 between the source/drains 345 and the buffer layer 342 may be thinner than a thickness of the channel layer 343 between the polarization layer 346 and the buffer layer 342.

In an embodiment, the source/drain regions 345 may be epitaxially grown semiconductor material. The doping concentration of the source/drain regions 345 may be heavily N-type (e.g., $N^+$ or $N^{++}$. The use of regrown semiconductor material enables low transistor RDS(on). While an epitaxially regrown semiconductor material is shown in FIG. 3, it is to be appreciated that the source/drain regions 345 may simply be doped instead of being regrown.

In an embodiment, a polarization layer 346 may be provided over the channel layer 343 between the source/drain regions 345. The polarization layer may comprise any suitable material. For example, the polarization layer 346 may comprise aluminum, gallium, and nitrogen (e.g., AlGaN). The polarization layer 346 may also induce a two-dimensional electron gas (2DEG) 344 at or around the interface between the polarization layer 346 and the channel layer 343. The high voltage and frequency performance of the switch 322 may be at least partially attributable to the formation of the 2DEG 344. In an embodiment, a passivation layer 347 is provided over the top surface of the polarization layer 346.

In an embodiment, the gate structure of the switch 322 may include the gate electrode 348 and a field plate 349. The gate electrode 348 passes through the passivation layer 347 and extends into the polarization layer 346. In the illustrated embodiment, the gate electrode 348 does not pass entirely through a thickness of the polarization layer 346. In other embodiments, the gate electrode 348 may pass entirely through the polarization layer 346. The bottom surface and sidewall surfaces of the gate electrode 348 may be lined with a high-k dielectric layer 350. As used herein, "high-k" may refer to a dielectric constant that is equal to or greater than the dielectric constant of silicon dioxide. For example, high-k dielectric layer 350 may comprise hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the field plate 349 may extend laterally away from the gate electrode 348. The field plate 349 may extend over a portion of the channel between the gate electrode 348 and the source/drain region 345. In a particular embodiment, the field plate 349 extends towards the drain region 345. The field plate 349 may help smooth out the electric field in the channel layer 343. This enables higher breakdown voltages in the switch 322. In the illustrated embodiment, a single field plate 349 is shown. In other embodiments, the field plate 349 may comprise a stepped configuration with longer portions of the field plate 349 further from the channel layer 343 than the shorter portions of the field plate 349. In an embodiment, the high-k dielectric 350 may also be provided below the field plate 349.

In an embodiment, the gate electrode 348 and the field plate 349 may be any suitable conductive material. The conductive material may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, a workfunction metal may also be included between the gate electrode 348 and the high-k dielectric 350.

In the illustrated embodiment, the electrical connections to the source/drain regions 345, the gate electrode 348, and the field plate 349 are not shown for simplicity. However, it is to be appreciated that back-end-of-line (BEOL) processing and structures may be used in order to provide electrical access to the switch 322. For example interlayer dielectric (ILD) material may be over the switch 322, and traces in the ILD material may be used to provide electrical coupling to the switch 322. For example, the ILD material may comprise or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. Common examples of conductive traces are the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers.

Figure 4A:
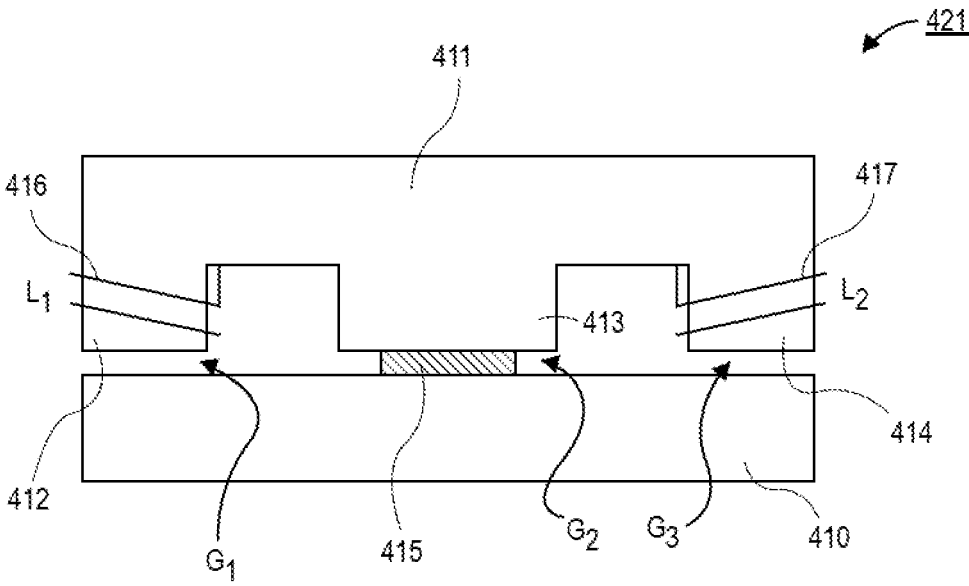
FIG. 4A is a cross-sectional illustration of a coupled inductor, in accordance with an embodiment.

Referring now to FIG. 4A, a cross-sectional illustration of an inductor 421 is shown, in accordance with an embodiment. In an embodiment, the inductor 421 is configured to switch between a coupled state and a decoupled state. The inductor 421 includes a first core 410, a second core 411, and a filler 415. The first core 410 and the second core 411 may have different shapes and are made from the same or different materials. Examples of these materials include ferromagnetic metals (e.g., iron) or alloys or any other material capable of supporting the formation of a magnetic field. The first core 410 and the second core 411 may be integrally formed. Alternatively, one or more of the cores 410 and 411 may have a laminated structure formed from combined plates or other structures.

The first core 410 may be configured to have multiple sections in different arrangements. In this embodiment, the first core 410 has substantially a bar, linear or I-shaped configuration, and the second core 411 has multiple sections, at least some of which extend towards the first core 410. In the example shown in FIG. 4A, the second core 411 has three sections extending toward the first core 410, namely a first section 412, a second section 413, and a third section 414 arranged in sequence and extending from a main section of second core 411. Arranged in this manner, the second core 411 substantially is in the shape of an E. Hence, the combination of the first core 410 and the second core 411 may be considered to have an "EI" configuration.

As shown in FIG. 4A, each section 412-414 of the second core 411 is spaced from the first core 410. The spacing between the first section 412 and first core 410 includes a gap G1, the spacing between the second section 413 and the first core 410 includes a gap G2, and the spacing between the third section 414 and the first core 410 includes a gap G3. The gaps affect the flow of magnetic flux and thus the inductance values of the different core sections. In one embodiment, all three gaps may be substantially the same. In other embodiments, one or more of the gaps may be different depending on the application of the inductor 421 and the magnetic flux to be generated.

In addition to or in lieu of setting the gap spacings, other inductor values may be set to achieve a desired level of performance for the inductor. For example, the number of windings 416 and 417 around the first section 412 and the third section 414, respectively, of the second core 411 may be different, and/or the type of conductors used to form the windings 416, 417 may be different. Based on the number of windings 416, 417, the type of conductors used for the windings 416, 417, and/or gap spacings G1-G3, different inductances may be generated in association with the first section 412 and the third section 414 of the second core 411. The inductance for the first section 412 is shown as $L_1$ and the inductance for the third section 414 is shown as $L_2$.

The filler 415 is located between the first core 410 and the second section 413 of the second core 411. In accordance with one embodiment, the second section 413 does not have any windings. This may help assist the inductor 421 to switch between coupled and decoupled states in a manner to be described in greater detail below. To facilitate switching between these states, the filler 415 is made from a material having a predetermined magnetic permeability.

In accordance with one embodiment, the filler 415 is made from a material having a magnetic permeability which lies in a predetermined range. This material may be the same or different from the material from which one of the first core 410 or second core 411 are made from. One example of the core material is a ferrite alloy.

In other applications, the filler 415 material may lie in a different range of magnetic permeability depending, for example, on the gap spacing and materials from which the cores 410 and 411 are made. In the embodiment of FIG. 4A, the areas between the sections of the second core 411 may be filled with a material having a low magnetic permeability or no magnetic permeability, or these areas may be air gaps. Also, gaps G1 and G3 may be air gaps or one or more of these gaps may be filled with a material of no or low magnetic permeability, depending on the given application.

The filler 415 between first core 410 and the second section 413 of the second core 411 may also have varying dimensions. In one embodiment, the filler 415 contacts the first core 410 and second section 413 on respective upper and lower surfaces. Alternatively, only one of the first core

410 and second section 413 may contact the filler, leaving a smaller spacing between the filler 415 and the other of the first core 410 or second section 413.

Also, in terms of lateral dimensions, the width of the filler 415 is shown in FIG. 4A to be less than a width of the second section 413 of the second core 411. However, in other embodiments, the filler 415 may have a different width and even one that is substantially equal to or greater than the width of the second section 413.

The inclusion of the filler 415 allows the inductor to switch between coupled and decoupled states. This switching is made possible based on changes in the saturation level of the filler 415 material. More specifically, in a magnetic circuit, magnetic flux will follow of the path of least magnetic reluctance. (Magnetic reluctance, therefore, may be considered to be analogous to resistance in an electric circuit). The saturation level of filler 415 in the gap G2 of FIG. 4A serves to control the path of travel of the magnetic flux. More specifically, in the inductor 421 of FIG. 4A, changes in the saturation level of the filler 415 changes the magnetic reluctance paths generated from the windings around respective ones of the core sections 412 and 414. This, in turn causes the inductor to switch between coupled and decoupled states.

In accordance with one embodiment, the saturation level of the filler 415 material (and thus state-switching) may be determined by the type of material chosen for the filler 415 and the size of the load current. Based on the magnetic permeability of the filler 415 material, the load current flowing through the windings 416 and 417 will cause the core windings 416 and 417 to have different inductances and will cause a substantial portion of the magnetic flux lines from the core windings 416 and 417 to follow different paths.

Figure 4B:
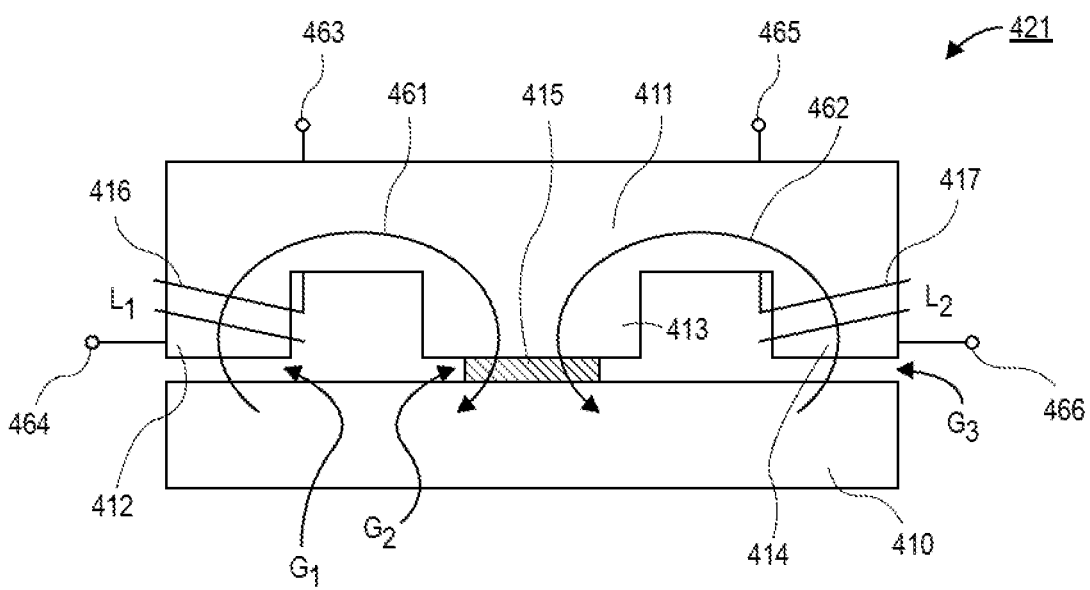
FIG. 4B is a cross-sectional illustration of a coupled inductor operating in a first state, in accordance with an embodiment.

Referring now to FIG. 4B, an example of magnetic flux patterns generated when the inductor 421 is operating a decoupled state is shown, in accordance with an embodiment. In this state, the windings 416 around the first core section 412 operate as a first inductor and the windings 417 around the third core section 414 operate as a second inductor. Because the first and second inductors operate separately, the inductor 421 is considered to be in a decoupled state.

This decoupled state occurs automatically based on a size of the load current flowing through the inductor in relation to the magnetic permeability of the filler 415 material. In this example, when the load current ($I_L$) is less than a predetermined threshold value ($I_{TH}$), the filler 415 material is in a magnetically unsaturated state. As a result, the magnetic flux 461 from the first inductor flows along a low magnetic reluctance path that passes through second section 413 of the second core 411 and the filler 415, and magnetic flux 462 from the second inductor flows along a low magnetic reluctance path that also passes through the second section 413 of the second core 411 and the filler 415.

Also, as shown, the magnetic flux 461 and 462 from the inductors may flow in different directions. This may be accomplished by sending current through the inductors in opposing directions. For example, current may be sent into inductor $L_1$ through terminal 464 and current may exit this inductor through terminal 463. Conversely, current may be sent into inductor $L_2$ through terminal 465 and current may exit this inductor through terminal 466.

Figure 4C:
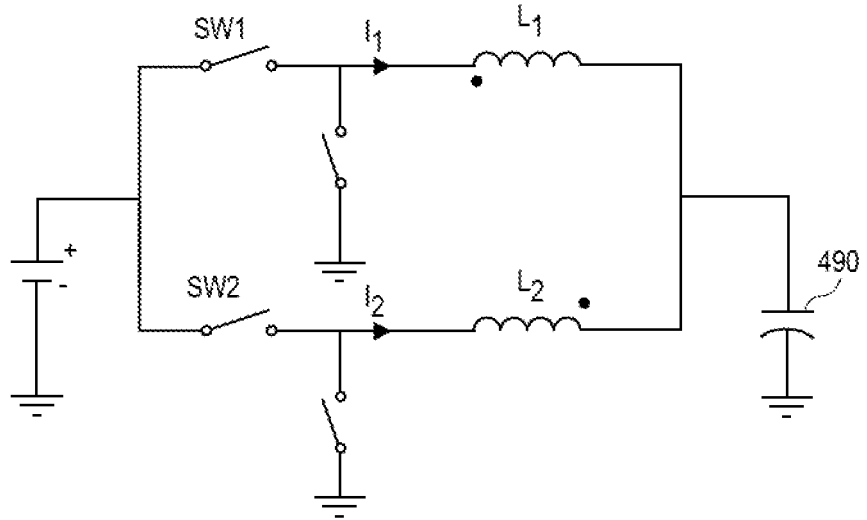
FIG. 4C is a circuit diagram of the VR module with the coupled inductor operating in the first state, in accordance with an embodiment.

Referring now to FIG. 4C, an equivalent circuit diagram of the inductor 421 corresponding to the state shown in 4B is shown, in accordance with an embodiment. In this diagram, because of the low inductance paths through the filler, the first and second inductors $L_1$ and $L_2$ operate separately based on currents $I_1$ and $I_2$ respectively flowing through their windings. In accordance with one embodiment, the sum of currents $I_1$ and $I_2$ may be considered to correspond to the load current.

Also, in FIG. 4C, switches SW1 and SW2 may be included for selectively switching the inductors to a circuit including the load to be driven. The switches SW1 and SW2 may be alternately closed to couple the same or different inductances of the inductors to a load, illustratively shown by capacitor 490, or only either of the switches SW1 and SW2 may be closed or both switches may be simultaneously closed depending on the requirements of the load. In an embodiment, the switches SW1 and SW2 may comprise GaN channels in order to operate at higher voltages and higher frequencies than silicon based switches. The switches SW1 and SW2 may have a structure substantially similar to the device shown and described above with respect to FIG. 3.

Figure 4D:
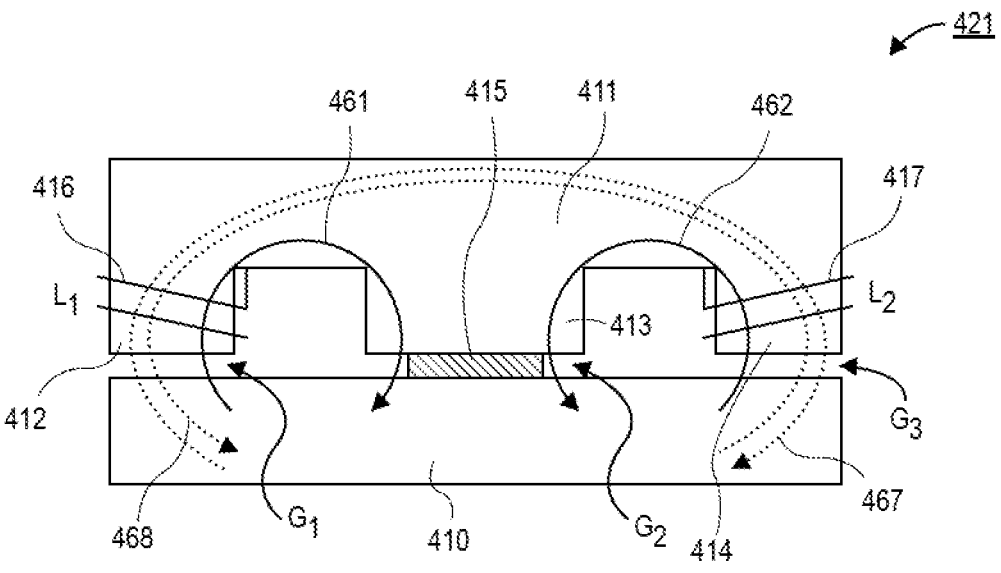
FIG. 4D is a cross-sectional illustration of a coupled inductor operating in a second state, in accordance with an embodiment.

Referring now to FIG. 4D, an example of magnetic flux generated when the inductor 421 is operating in a coupled state is shown, in accordance with an embodiment. In this state, the windings 416 around the first section 412 of the second core 411 and the windings 417 around the third section 414 of the second core 411 produce magnetic flux which is added together to form the flux (and thus the inductance) of a coupled inductor.

If the flux 461 and 462 from the windings 416 and 417 flows in the same direction, the net flux (and thus inductance) in the coupled state will be greater than the individual inductances of the windings (e.g., $L_{Coupled\ State}=L_1-L_2$, or $L_{Coupled\ State}=L_2+L_1$, or even $L_{Coupled\ State}=L_1+L_2$ in certain circumstances). Conversely, if the flux 461 and 462 from the windings 416 and 417 flows in different directions, some of the flux from one winding 416 or 417 will cancel the flux from the other winding 416 or 417, producing a net flux (and inductance) in the coupled state that is less than one or both of the windings taken individually.

This coupled state occurs automatically based on a size of the load current in relation to the magnetic permeability of the filler 415 material. In this example, when the load current ($I_L$) is greater than the predetermined threshold value ($I_{TH}$), the filler 415 material is magnetically saturated. As a result, the filler 415 material functions essentially as a non-magnetic material (e.g., one that is not magnetically permeable such as air) and the magnetic flux from the first inductor $L_1$ and the second inductor $L_2$ will flow through the second section 413 of the second core 411, but a substantial amount of this flux will not flow through filler 415.

In operation, the current may be switched into both or only one of the windings 416 or 417. If current is only switched into one of windings 416 or 417, the direction of flow of the magnetic flux of the inductor 421 in the coupled state is determined by the inductor winding which receives the input current. For example, if winding 416 receives the input load current, then the magnetic flux of inductor 421 in the coupled state traverses a clockwise path 467. If winding 417 receives the input load current, then the magnetic flux of inductor 421 in the coupled state traverses counterclockwise path 468. If current is switched into both windings 416 and 417, the direction of flow of the magnetic flux of the inductor 421 in the coupled state may be determined by a sum of the flux for the individual windings 416 and 417.

Figure 4E:
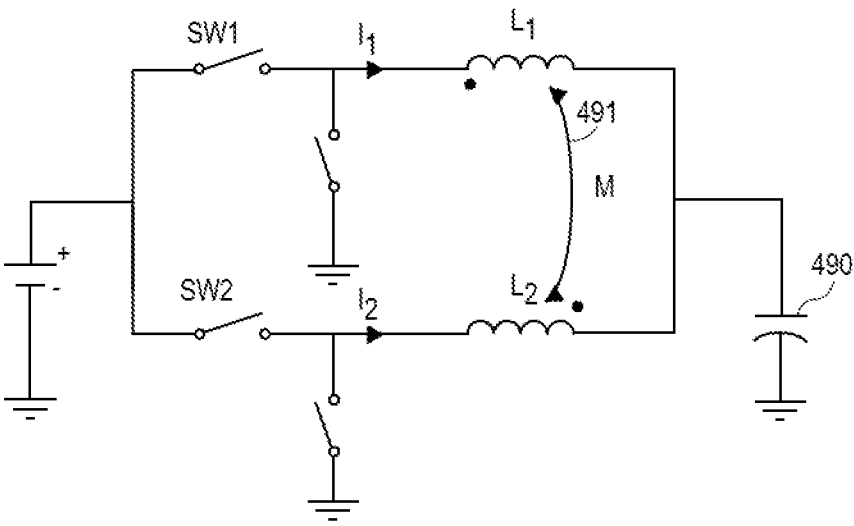
FIG. 4E is a circuit diagram of the VR module with the coupled inductor operating in the second state, in accordance with an embodiment.

Referring now to FIG. 4E, an equivalent circuit diagram of the inductor 421 in the coupled state corresponding to FIG. 4D is shown, in accordance with an embodiment. In this diagram, because of the filler 415 is saturated, the inductance path through the filler 415 is too high to pass any substantial amount of magnetic flux. Consequently, as shown by arrow 491, the inductors $L_1$ and $L_2$ operate in a coupled state having a magnetic flux direction and coupled inductance value based on which switch SW1 or SW2 is closed. In FIG. 4E, the letter M indicates the formation of a mutual inductance between the core windings 416 and 417. That is, the letter M provides an indication of the extent of coupling between the windings.

Also, in FIG. 4E, the dots adjacent the windings denote the voltage polarity with respect to the windings 416 and 417. For example, when current enters the dot corresponding to the windings of $L_1$, energy is induced in the windings of $L_2$ and current is output along the circuit path coupled to the dot of this second winding 417.

Figure 5:
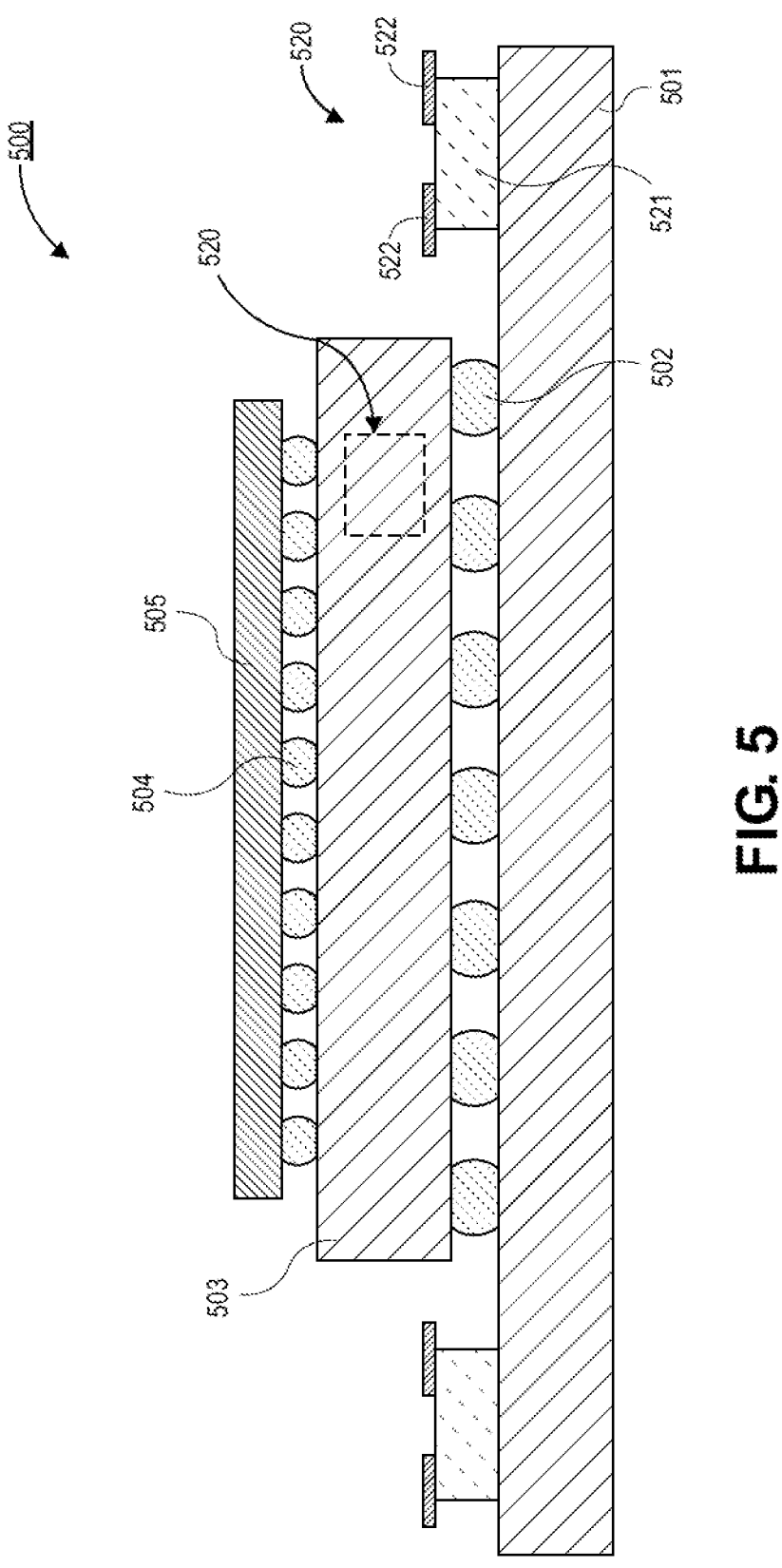
FIG. 5 is a cross-sectional illustration of an electronic system with VR modules on the board, in accordance with an embodiment.

Referring now to FIG. 5, a cross-sectional illustration of an electronic system 500 is shown, in accordance with an embodiment. In an embodiment, the electronic system 500 comprises a board 501, such as a PCB. The board 501 may be coupled to a package substrate 503 by interconnects 502. The interconnects 502 are shown as solder balls, but it is to be appreciated that any interconnect architecture may be used for the interconnects 502. For example, interconnects 502 may be sockets or the like. In an embodiment, the package substrate 503 may be coupled to a die 505 by interconnects 504. While shown as solder bumps, it is to be appreciated that interconnects 504 may be any suitable first level interconnect (FLI) architecture. In the illustrated embodiment, a single die 505 is shown. However, it is to be appreciated that embodiments may include multi-die architectures as well. In an embodiment, the die 505 may be a processor, a graphics processor, an accelerator, or the like.

In an embodiment, one or more VR modules 520 may be coupled to the board 501. Implementations of the VR modules 520 may optionally be integrated into or on the package substrate 503. In an embodiment, the VR module 520 may comprise a coupled inductor 521 and a pair of switches 522. In an embodiment, the switches may be GaN based switching topologies.

Figure 6:
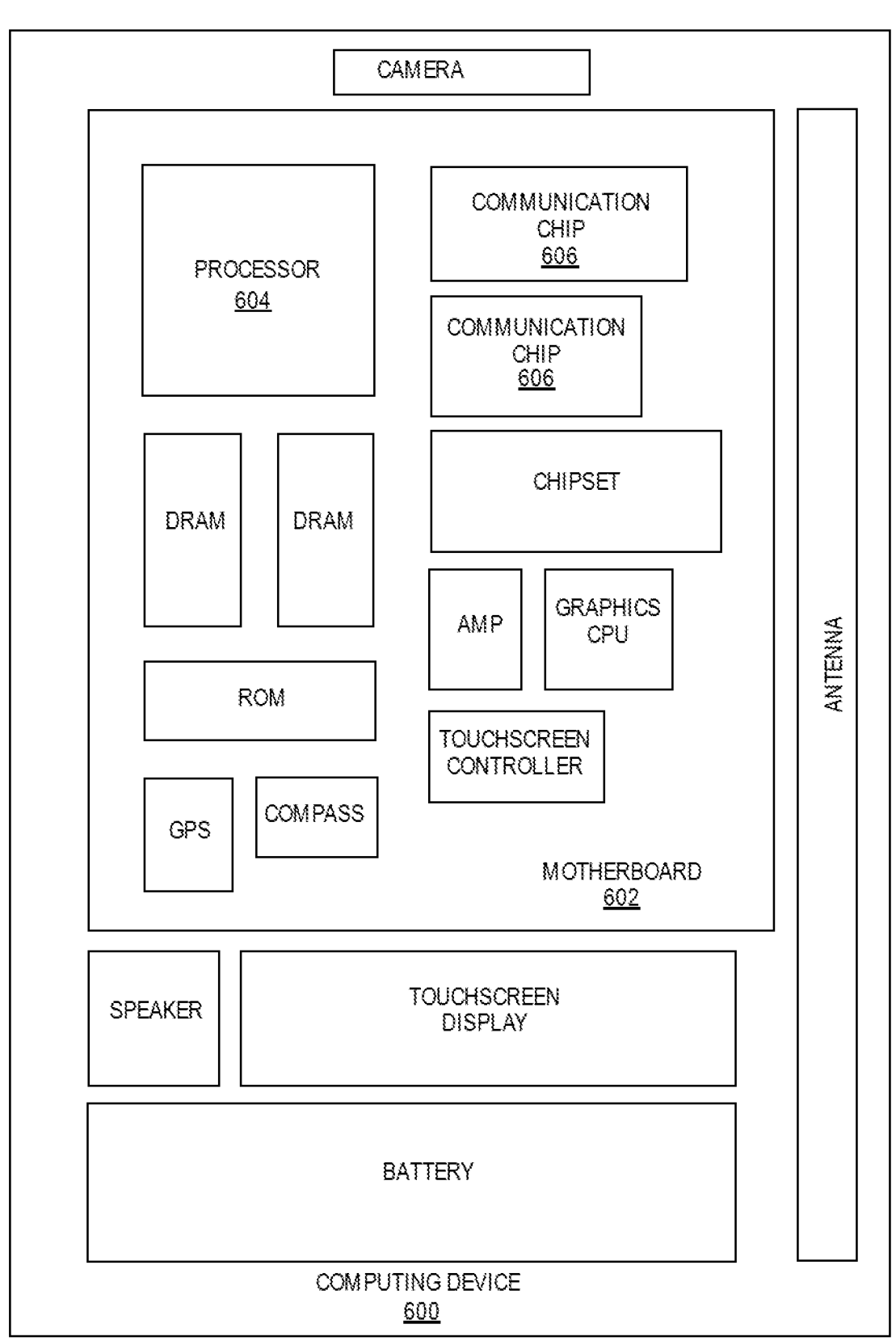
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may part of an electronic package that includes a VR module with a coupled inductor and a pair of GaN switches, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may part of an electronic package that includes a VR module with a coupled inductor and a pair of GaN switches, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an apparatus, comprising: a first inductor; a second inductor, wherein the first inductor can be coupled to the second inductor; a first semiconductor device coupled to the first inductor, wherein the first semiconductor device comprises gallium and nitrogen; and a second semiconductor device coupled to the second inductor, wherein the second semiconductor device comprises gallium and nitrogen.

Example 2: the apparatus of Example 1, wherein the first inductor and the second inductor are formed from a first core and a second core.

Example 3: the apparatus of Example 2, wherein the second core comprises: a main section; a first section extending out from the main section; a second section extending out from the main section; and a third section extending out from the main section.

Example 4: the apparatus of Example 3, further comprising: a filler between the second section and the first core, wherein the first section and the first core form the first inductor, and wherein the third section and the first core form the second inductor.

Example 5: the apparatus of Examples 1-4, wherein each of the first semiconductor device and the second semiconductor device comprise a field plate.

Example 6: the apparatus of Examples 1-5, wherein each of the first semiconductor device and the second semiconductor device comprise a polarization layer and a passivation layer over a channel, and wherein a gate electrode passes through the passivation layer and into the polarization layer.

Example 7: the apparatus of Example 6, wherein a gate oxide lines the gate electrode.

Example 8: the apparatus of Example 6 or Example 7, wherein the channel comprises the gallium and the nitrogen.

Example 9: the apparatus of Examples 1-8, wherein source and drain regions of the first semiconductor device and the second semiconductor device are epitaxial semiconductor layers.

Example 10: the apparatus of Examples 1-9, wherein the coupled inductor is mechanically and electrically coupled to a printed circuit board.

Example 11: the apparatus of Example 10, further comprising: a plurality of apparatuses mechanically and electrically coupled to the printed circuit board.

Example 12: the apparatus of Example 11, wherein the plurality of apparatuses comprises up to eight coupled apparatuses.

Example 13: an apparatus, comprising: a first core; a second core adjacent to the first core, wherein the second core comprises: a main section; a first section extending out from the main section; a second section extending out from the main section; and a third section extending out from the main section; a filler between the second section and the first core; a first switch comprising gallium and nitrogen; and a second switch comprising gallium and nitrogen.

Example 14: the apparatus of Example 13, wherein the filler comprises iron.

Example 15: the apparatus of Example 13 or Example 14, further comprising: a first conductive winding around the first section; and a second conductive winding around the third section.

Example 16: the apparatus of Examples 13-15, wherein the gallium and nitrogen of the first switch and the second switch are in a channel of the first switch and a channel of the second switch.

Example 17: the apparatus of Examples 13-15, wherein the coupled inductor is to operate in a first state when a level of magnetic flux that is to pass through the filler is at an unsaturated level, and wherein the coupled inductor is to operate in a second state when the level of magnetic flux that is to pass through the filler is at a saturated level.

Example 18: the apparatus of Example 17, wherein a first inductor and a second inductor are to operate as decoupled inductors in the first state and are to operate as a coupled inductor in the second state.

Example 19: the apparatus of Examples 13-18, wherein each of the first switch and the second switch comprise a field plate.

Example 20: the apparatus of Examples 13-19, wherein each of the first switch and the second switch comprise a polarization layer and a passivation layer over a channel, and wherein a gate electrode passes through the passivation layer and into the polarization layer.

Example 21: the apparatus of Example 20, wherein a gate oxide lines the gate electrode.

Example 22: the apparatus of Example 20 or Example 21, wherein the channel comprises the gallium and the nitrogen.

Example 23: an electronic system, comprising: a board; a package substrate coupled to the board; a die coupled to the package substrate; and a coupled inductor coupled to the board, wherein the coupled inductor comprises: a first inductor; a second inductor; a first semiconductor device comprising gallium and nitrogen; and a second semiconductor device comprising gallium and nitrogen.

Example 24: the electronic system of Example 23, further comprising a plurality of coupled inductors coupled to the board.

Example 25: the electronic system of Example 23 or Example 24, wherein the first inductor is configured to be coupled to the second inductor.

What is claimed is:

1. An apparatus, comprising:
a first inductor;
a second inductor, wherein the first inductor is coupled to the second inductor;
a first semiconductor device coupled to the first inductor; and
a second semiconductor device coupled to the second inductor, wherein each of the first semiconductor device and the second semiconductor device comprises a channel layer comprising gallium and nitrogen, a source region on a first portion of the channel layer and a drain region on a second portion of the channel layer opposite the first portion, wherein a thickness of the first and second portions of the channel layer is less than a thickness of a third portion of the channel layer between the source region and the drain region, a polarization layer on the third portion of the channel layer, a passivation layer on the polarization layer, the passivation layer having a maximum lateral width along a source region to drain region direction the same as a maximum lateral width of the polarization layer along the source region to drain region direction, and a gate structure laterally between the source region and the drain region, the gate structure comprising a gate oxide that lines a gate electrode, the gate structure having an uppermost surface above an uppermost surface of the passivation layer, and the gate structure having a portion extending through the passivation layer and into but not entirely through the polarization layer, wherein the portion of the gate structure is laterally offset between the source region and the drain region.

2. The apparatus of claim 1, wherein the first inductor and the second inductor are formed from a first core and a second core.

3. The apparatus of claim 2, wherein the second core comprises:
a main section;
a first section extending out from the main section;
a second section extending out from the main section; and
a third section extending out from the main section.

4. The apparatus of claim 3, further comprising:
a filler between the second section and the first core, wherein the first section and the first core form the first inductor, and wherein the third section and the first core form the second inductor.

5. The apparatus of claim 1, wherein each of the first semiconductor device and the second semiconductor device comprise a field plate.

6. The apparatus of claim 1, wherein the source and drain regions of the first semiconductor device and the second semiconductor device are epitaxial semiconductor layers.

7. The apparatus of claim 1, wherein the first inductor and the second inductor are mechanically and electrically coupled to a printed circuit board.

8. The apparatus of claim 7, further comprising:
a plurality of apparatuses mechanically and electrically coupled to the printed circuit board.

9. The apparatus of claim 8, wherein the plurality of apparatuses comprises up to eight coupled apparatuses.

10. An apparatus, comprising:
a first core;
a second core adjacent to the first core, wherein the second core comprises:
a main section;
a first section extending out from the main section;
a second section extending out from the main section; and
a third section extending out from the main section;
a filler between the second section and the first core;
a first switch; and
a second switch, wherein each of the first switch and the second switch comprises a channel layer comprising gallium and nitrogen, a source region on a first portion of the channel layer and a drain region on a second portion of the channel layer opposite the first portion, wherein a thickness of the first and second portions of the channel layer is less than a thickness of a third portion of the channel layer between the source region and the drain region, a polarization layer on the third portion of the channel layer, a passivation layer on the polarization layer, the passivation layer having a maximum lateral width along a source region to drain region direction the same as a maximum lateral width of the polarization layer along the source region to drain region direction, and a gate structure laterally between the source region and the drain region, the gate structure comprising a gate oxide that lines a gate electrode, the gate structure having an uppermost surface above an uppermost surface of the passivation layer, and the gate structure having a portion extending through the passivation layer and into but not entirely through the polarization layer, wherein the portion of the gate structure is laterally offset between the source region and the drain region.

11. The apparatus of claim 10, wherein the filler comprises iron.

12. The apparatus of claim 10, further comprising:
a first conductive winding around the first section; and
a second conductive winding around the third section.

13. The apparatus of claim 10, wherein the apparatus is to operate in a first state when a level of magnetic flux that is to pass through the filler is at an unsaturated level, and wherein the apparatus is to operate in a second state when the level of magnetic flux that is to pass through the filler is at a saturated level.

14. The apparatus of claim 13, wherein a first inductor and a second inductor are to operate as decoupled inductors in the first state and are to operate as a coupled inductor in the second state.

15. The apparatus of claim 10, wherein each of the first switch and the second switch comprise a field plate.

16. An electronic system, comprising:

a board;

a package substrate coupled to the board;

a die coupled to the package substrate; and a coupled inductor coupled to the board, wherein the coupled inductor comprises:

a first inductor;

a second inductor;

a first semiconductor device; and a second semiconductor device comprising gallium and nitrogen, wherein each of the first semiconductor device and the second semiconductor device comprises a channel layer comprising gallium and nitrogen, a source region on a first portion of the channel layer and a drain region on a second portion of the channel layer opposite the first portion, wherein a thickness of the first and second portions of the channel layer is less than a thickness of a third portion of the channel layer between the source region and the drain region, a polarization layer on the third portion of the channel layer, a passivation layer on the polarization layer, the passivation layer having a maximum lateral width along a source region to drain region direction the same as a maximum lateral width of the polarization layer along the source region to drain region direction, and a gate structure laterally between the source region and the drain region, the gate structure comprising a gate oxide that lines a gate electrode, the gate structure having an uppermost surface above an uppermost surface of the passivation layer, and the gate structure having a portion extending through the passivation layer and into but not entirely through the polarization layer, wherein the portion of the gate structure is laterally offset between the source region and the drain region.

17. The electronic system of claim 16, further comprising a plurality of coupled inductors coupled to the board.

18. The electronic system of claim 16, wherein the first inductor is configured to be coupled to the second inductor.

* * * * *